(12) United States Patent
Faley et al.

(10) Patent No.: US 9,481,928 B2
(45) Date of Patent: Nov. 1, 2016

(54) SPUTTERING SOURCES FOR HIGH-PRESSURE SPUTTERING WITH LARGE TARGETS AND SPUTTERING METHOD

(75) Inventors: Mikhail Faley, Juelich (DE); Ulrich Poppe, Dueren (DE)

(73) Assignee: Forschungszentrum Juelich GmbH, Juelich (DE)

( * ) Notice: Subject to any disclaimer, the term of this patent is extended or adjusted under 35 U.S.C. 154(b) by 0 days.

(21) Appl. No.: 13/876,648

(22) PCT Filed: Sep. 17, 2011

(86) PCT No.: PCT/DE2011/001744
§ 371 (c)(1),
(2), (4) Date: Mar. 28, 2013

(87) PCT Pub. No.: WO2012/051980
PCT Pub. Date: Apr. 26, 2012

(65) Prior Publication Data
US 2013/0199924 A1    Aug. 8, 2013

(30) Foreign Application Priority Data
Oct. 22, 2010    (DE) .................. 10 2010 049 329

(51) Int. Cl.
*C23C 14/34*    (2006.01)
*C23C 14/35*    (2006.01)
(Continued)

(52) U.S. Cl.
CPC ............. *C23C 14/35* (2013.01); *C23C 14/562* (2013.01); *H01J 37/3408* (2013.01); *H01J 37/3452* (2013.01)

(58) Field of Classification Search
CPC ............. H01J 37/3402; H01J 37/3408; H01J 37/3405; C23C 14/3407

USPC .......................... 204/298.16, 298.17, 298.19
See application file for complete search history.

(56) References Cited

U.S. PATENT DOCUMENTS

| 4,883,574 A | 11/1989 | dos Santos Pereina Ribeiro |
| 5,262,030 A | 11/1993 | Potter |

(Continued)

FOREIGN PATENT DOCUMENTS

| DE | 37 26731 | 2/1989 |
| DE | 101 19 533 | 10/2002 |

(Continued)

OTHER PUBLICATIONS

Translation to Mucke (DE 10138156) published Feb. 2003.*

(Continued)

*Primary Examiner* — John Brayton
(74) *Attorney, Agent, or Firm* — Jordan and Koda, PLLC

(57) ABSTRACT

A sputtering head comprises a receiving area for a sputtering target (target receptacle). The sputtering head comprises one or more magnetic field sources so as to generate a stray magnetic field. The magnetic north and the magnetic south of at least one magnetic field source, between which the stray field forms, are located 10 mm or less, preferably 5 mm or less, and particularly preferably approximately 1 mm apart. It was found that, notably when sputtering at a high sputtering gas pressure of 0.5 mbar or more, the degree of ionization of the sputtering plasma, and consequently also the ablation rate of the sputtering target, can be locally adjusted by such a locally effective magnetic field. This allows the thicknesses of the layers that are obtained to be more homogeneous over the surface of the substrate. Advantageously, the sputtering head additionally comprises a solid state insulator, which surrounds the base body comprising the target receptacle and the sputtering target (all connected to potential) and electrically insulates the same from the shield that spatially limits the material ablation to the sputtering target (connected to ground).

22 Claims, 7 Drawing Sheets

(51) Int. Cl.
  *C23C 14/56* (2006.01)
  *H01J 37/34* (2006.01)

(56) References Cited

U.S. PATENT DOCUMENTS

| | | | |
|---|---|---|---|
| 5,415,753 A * | 5/1995 | Hurwitt et al. | 204/192.12 |
| 5,435,881 A | 7/1995 | Ogle | |
| 6,132,576 A * | 10/2000 | Pearson | 204/298.2 |
| 6,432,285 B1 | 8/2002 | Kastanis et al. | |
| 8,231,767 B2 * | 7/2012 | Iori et al. | 204/298.16 |
| 2002/0008017 A1 | 1/2002 | Fu | |
| 2004/0140204 A1 | 7/2004 | Navala et al. | |
| 2008/0242087 A1 | 10/2008 | Matsunaka et al. | |
| 2010/0294656 A1* | 11/2010 | Ikeda et al. | 204/298.11 |

FOREIGN PATENT DOCUMENTS

| | | |
|---|---|---|
| DE | 10138156 A1 * | 2/2003 |
| EP | 0 242 826 | 10/1987 |
| EP | 0 295 649 | 12/1988 |
| EP | 0 413 354 | 8/1990 |
| EP | 0 897 189 | 2/1999 |
| JP | 63-192866 | 8/1988 |
| JP | 63-199866 | 8/1988 |
| JP | 2-080565 | 3/1990 |
| JP | 3-100173 | 4/1991 |
| JP | 5-96055 | 12/1993 |
| WO | WO-2006/034598 | 4/2006 |
| WO | WO 2009/078094 * | 6/2009 |
| WO | WO 2009/157186 * | 12/2009 |

OTHER PUBLICATIONS

Japanese Patent Application No. 2013-534162 Examination Report dated Feb. 17, 2015.

* cited by examiner

A - A

SPUTTERING SOURCES FOR HIGH-PRESSURE SPUTTERING WITH LARGE TARGETS AND SPUTTERING METHOD

BACKGROUND OF THE INVENTION

During sputtering, a vacuum is first produced in a sputtering chamber, and then an atmosphere of a sputtering gas having a defined pressure is created. A gas discharge of the sputtering gas is ignited in the vicinity of a sputtering target that is attached to a sputtering head and generally kept at a negative potential. A sputtering plasma comprising positively charged ions and free electrons is created from the electrically neutral atoms or molecules of the sputtering gas. The positively charged ions are accelerated by the negative potential of the target on the surface thereof and there, by way of momentum transfer, knock out material, some of which travels in the direction of the substrate to be coated as a result of rebound and is deposited there. At the same time, these ions release electrons from the target as a result of this bombardment, which are accelerated by the electric field in the direction of the sputtering plasma and there ionize further atoms or molecules of the sputtering gas by way of collisions. The sputtering plasma in this way is self-sustaining.

So as to be able to coat larger substrates in one operation, the use of larger sputtering targets is being pursued. However, as the target size increases, the plasma becomes increasingly unstable. During magnetron sputtering, this effect is counteracted by the field lines of a permanent-magnetic field extending through the plasma. In the case of round sputtering targets, this field generally runs between a permanent-magnetic ring that is provided at the edge of the receptacle for the sputtering target and an additional permanent magnet that is provided in the center of this target receptacle. A portion of the stray magnetic field runs in curved field lines through the space in which the sputtering plasma is located. This stray magnetic field forces free electrons onto long cycloid tracks transversely relative to the electric and magnetic fields through the sputtering plasma, where these electrons ionize atoms of the sputtering gas by way of a large number of collisions and thereby contribute to sustaining the plasma.

The disadvantage is that this method works only at a comparatively low pressure. At higher pressure, the mean free path becomes too short for the electrons, so that these can only accumulate where the magnetic field is the strongest. Where this field is weaker, the plasma is also weaker. The intensity of the sputtering plasma consequently becomes inhomogeneous over the surface of the sputtering target. In the extreme case, the plasma breaks down into several separate parts, which are usually localized next to the magnetic poles of the permanent magnet.

However, higher pressure is specifically required for sputtering oxidic layers in an oxygen atmosphere. The shorter mean free path causes the undesirable effect that fewer negative oxygen ions are thrown against the substrate due to repulsion from the target and damage the layer already deposited on the substrate, or ablate the same nonstoichiometrically (back sputtering effect). In addition, a high pressure is advantageous so as to transfer an oxidic layer from the target to the substrate with the proper stoichiometry during the deposition process. Some materials can only form a stable stoichiometric phase in the deposited layer when the partial pressure of oxygen is relatively high.

Thus, it is the object of the invention to provide a sputtering head that generates a stable plasma over the entire surface of the sputtering target at high pressure. It is another object of the invention to provide a method by which target material can be deposited on a substrate in a homogeneous layer thickness at high pressure.

These objects are achieved according to the invention by a sputtering head according to the main and additional independent claims, and by a method according to another independent claim. Further advantageous embodiments will be apparent from the respective dependent claims.

SUMMARY OF THE INVENTION

A sputtering head was developed within the scope of the invention, which comprises a receiving area for a sputtering target (target receiving area) on a target holder (base body). The target receiving area can also have any arbitrary curvature, wherein from a practical perspective the shape of a plane has several advantages. For sputtering, the target can, for example, be soldered, glued or sintered to the target receiving area. The sputtering head comprises one or more magnetic field sources so as to generate a stray magnetic field having field lines that exit the surface of the sputtering target and then re-enter the same.

According to the invention, the magnetic north and the magnetic south of at least one magnetic field source, between which the stray magnetic field is formed, are located 10 mm or less, preferably 5 mm or less, and particularly preferably approximately 1 mm apart. The lower expedient limit for this distance is determined by the distance between the sputtering target and the sputtering plasma (cathode dark space). The magnetic field is intended to extend the path of electrons through the sputtering plasma so as to increase the likelihood for additional atoms of the sputtering gas to be ionized along this path. For this purpose, the field must extend through the cathode dark space into the sputtering plasma. The sputtering head according to the invention is intended to improve sputtering at high pressures of 0.5 mbar or more, preferably of 1 mbar or more. At such a high pressure, the cathode dark space typically extends over several tenths of a millimeter. So as to be able to influence the plasma, the magnetic field must overcome both this dark space and the distance from the target surface to the permanent magnet.

The smallest technologically expedient distance between the magnetic north and magnetic south then typically appears to be 0.8 mm, preferably approximately 1 mm. For this purpose, the shortest distance is meant to denote the distance between the magnetic north and south, which both generally have a spatial expansion to some extent. The small distance between the magnetic south and magnetic north localizes the magnetic field and maximizes the components of the stray field along the target receiving area, which is to say, maximizes the projection of the stray field onto the target receiving area.

It was found that, notably when sputtering at high pressure between approximately 0.5 and approximately 5 mbar, the degree of ionization of the sputtering plasma, and consequently also the ablation rate of the sputtering target, can be locally adjusted by such a locally effective magnetic field. For this purpose, the inventors have taken advantage of the fact that the distance between the sputtering target and the sputtering plasma (cathode dark space) is determined by the mean free path for electrons and ions of the sputtering gas, this path in turn being highly dependent on the pressure. At lower pressure of around $10^{-2}$ mbar or less, the cathode dark space can extend several centimeters. Because of the long cycloid tracks of the electrons in the stray magnetic field, collisions between the electrons and atoms of the sputtering gas become more likely even at a smaller distance from the target. The plasma is thus ionized sooner, whereby the cathode dark space is slightly reduced. At a sputtering gas pressure of $10^{-2}$ mbar or less, however, it is almost impossible to push to the extent of the cathode dark space below 1 cm, even when using very strong magnetic fields. A magnetic field that is localized as claimed is also so highly localized in terms of the spatial dimension perpendicular to the area of the target receptacle that only a fraction of the field lines penetrates the cathode dark space into the sputtering plasma, and the magnetic field strength there is very weak. Electrons emitted from the surface of the sputtering target thus cannot be directed along these field lines through the sputtering plasma, so that they contribute only slightly to the further ionization of this plasma.

In contrast, at a pressure between approximately 0.5 and approximately 5 mbar, a cathode dark space in the range of less than 1 mm, or even less than 0.1 mm, is present, which the localized field can easily penetrate. Electrons emitted from the target surface are primarily directed through the plasma in a precession movement that is transverse relative to the field lines of the magnetic field (cycloid tracks), whereby the paths thereof inside the plasma are increased. This results in a greater number of collisions between the electrons and the atoms or molecules of the sputtering gas, whereby the same is ionized more strongly. The positively charged ions are attracted by the negatively charged sputtering head and contribute to the material ablation. The degree of ionization is also locally increased by the local stray magnetic field in a similar manner during radio frequency sputtering (RF sputtering). With RF sputtering, a radio frequency alternating field is present between the target receptacle and ground, instead of a negative potential. The target is polarized during each positive half-wave of the alternating field, and material is ablated during the negative half-wave. In this way, it is also possible to use insulators as coating materials.

The locally effective magnetic field thus allows the degree of ionization of the plasma, and consequently also the ablation rate during sputtering, to be locally adjusted. As a consequence, layers having more homogeneous layer thicknesses can be produced on the substrate when using the sputtering head according to the invention than with sputtering heads according to the prior art, with otherwise identical parameters. Because the degree of ionization of the sputtering plasma is distributed more homogeneously than on sputtering heads according to the prior art, larger sputtering plasmas, and therefore also larger sputtering targets, can be employed, whereby larger workpieces can be coated in one operation. As a side effect, the target is additionally worn more homogeneously. During conventional magnetron sputtering, the ablation is concentrated in a circular groove, for example; if the target has been completely penetrated at this site, this must be replaced, even though only a fraction of the entire mass thereof has been ablated.

These effects play a role in particular if the sputtering target and/or substrate that are used are considerably larger than the distance between the sputtering target and the substrate. This distance is only approximately 10 to 30 mm for sputtering gas pressures starting at around 0.5 mbar.

It was further found that, during magnetron sputtering according to the prior art, the inhomogeneous ablation rate is the onset of a self-reinforcing process, which destabilizes the sputtering plasma when larger targets are used. Heat is continually generated in the sputtering plasma and also heats the target. This applies in particular if sputtering is carried out at high pressure and the cathode dark space between the plasma and the target is very thin. Because ions of the sputtering gas are attracted by the negative potential of the target, a positive current flows in the direction of target during sputtering. In addition, negative oxygen ions are repelled from the target during sputtering in an oxygen atmosphere, which corresponds to a further positive current component in the direction of the target. The target poses a resistance to the overall current, with this resistance decreasing as the temperature rises, especially in the case of semiconducting targets. A higher portion of the sputtering current thus concentrates where the target is hotter to begin with. Current is withdrawn from other locations on the target for this purpose. In the case of smaller targets, equalizing currents still counteract this process inside the target. However, if the targets are larger, this is no longer sufficient, so that the sputtering plasma collapses in locations on the target that are deficient of sputtering current. By assuring, according to the invention, a homogeneous ionization of the plasma from the start, and thus a homogeneous ablation rate, no irregular distribution of the sputtering current that could self-reinforce in this manner develops on the target. As a result, larger targets can be sputtered when using the sputtering head according to the invention than during conventional magnetron sputtering.

The sputtering head according to the invention also allows the material ablation from the sputtering target to be customized in the sense that regions on the target are spared from ablation. In the projection of the stray field of each magnetic field source onto the surface of the target receptacle, advantageously the region in which at least 90% of the field strength is concentrated is located completely outside a predetermined region that is to be spared from ablation. For example, the edge region (for example 20% or less, preferably 10% or less, and particularly preferably 5% or less) of a round sputtering target can be predetermined as such a region, if the target receiving area for the sputtering target is surrounded by a shield so as to spatially limit the material ablation to the sputtering target. It is then undesirable for the sputtering plasma to come too close to the gap between the target receptacle and the shield, because this may cause flashover.

It is the general idea of the invention to compensate for inhomogeneities in the intensity of the sputtering plasma by locally influencing the sputtering plasma using local magnetic fields. What is important here is that, as differs from magnetron sputtering according to the prior art, the region of the target surface that is influenced by a magnetic field source is small compared to the entire surface area of the target surface. The invention therefore also relates to a sputtering head, comprising a receptacle for a sputtering target and one or more magnetic field sources so as to generate a stray magnetic field having field lines that exit the surface of the sputtering target and then re-enter the same, wherein this sputtering head is characterized in that, in the projection of the magnetic field of at least one magnetic field source onto the target receiving area, at least 90%, and preferably at least 95% of the field strength is concentrated on an area of 10% or less, preferably 5% or less, and particularly preferably 1% or less, of the target receiving area.

The local influence of the sputtering plasma by local magnetic fields improves the homogeneity of the coating even more so as the size of the sputtering target increases. Thus, the target receiving area for receiving a sputtering target advantageously has a diameter of 30 mm or more, preferably of 50 mm or more, and particularly preferably of 60 mm or more.

However, locally influencing the sputtering plasma by way of local magnetic fields also means that the sputtering target that is employed need not be circular. Using the positions and strengths of the magnetic field sources, it is possible to generate a field distribution on any arbitrarily shaped target surface that results in a sputtering plasma having homogeneous intensity, and consequently results in homogeneous material ablation. Thus, the invention also relates more generally to a sputtering head, comprising a receptacle for a sputtering target and one or more magnetic field sources, so as to generate a stray magnetic field having field lines that exit the surface of the sputtering target and re-enter the same, wherein this sputtering head is characterized by being designed to receive a non-circular target, and more particularly a target having an elliptical, star-shaped or polygonal surface. For example, this design can take the form of the target receiving area having a corresponding shape. As an alternative thereto or even in combination therewith, a target receiving area that is larger and/or shaped differently than the surface of the sputtering target can also be shielded by a solid state insulator that can be fixed in front of the surface of the target receptacle facing the sputtering plasma, so that the material ablation is limited to the target surface or parts thereof. No material ablation then takes place directly by the sputtering head. The specific description section provides two exemplary embodiments, which employ rectangular sputtering targets for coating band-shaped substrates. The ablation rate is locally adjusted to the band shape of the substrate in these exemplary embodiments by linear arrangements of magnetic field sources.

In a particularly advantageous embodiment of the invention, the sputtering head comprises a base body, which carries the target receiving area and thus, during operation, al carries the sputtering target, and additionally comprises a shield that surrounds the sputtering target so as to spatially limit the material ablation to the sputtering target. According to the invention, a solid state insulator is arranged between the base body (comprising the target receiving area and sputtering target) and the shield. The base body comprising the target receiving area and the sputtering target is generally connected to electrical potential, while the shield is connected to ground potential. Voltages (or AC voltage amplitudes in the case of RF sputtering) of several hundred volts are thus present between the base body (comprising the target receiving area and the sputtering target) and the shield. However, the gap between the base body (comprising the target receiving area and sputtering target) and the shield must be smaller than the mean free path, so that no undesirable plasma can form therein. In a larger gap, electrons can be accelerated due to repulsion from the negative potential and can ionize gas atoms, wherein additional ions and electrons are released. Thus, in a cascade effect, a plasma can form in the gap between the shield and the base body comprising the target receiving area, and the sputtering target and cause electric flashover.

As the sputtering gas pressure increases, the mean free path decreases, and consequently so does the permissible gap width. With an identical applied voltage, the electric field strength over the gap thus increases. At the same time, the breakdown field strength of the atmosphere in the sputtering chamber decreases, especially if an oxygen-containing atmosphere is selected, as in the experiments conducted by the inventors. The development of electric flashover can thus be the limiting factor for the maximum practicable sputtering gas pressure at which sputtering is possible. The solid state insulator then has a considerably higher breakdown field strength than an oxygen-containing atmosphere. At the same time, the insulator occupies a volume between the base body (comprising the target receiving area and the sputtering target) and the shield, this volume being no longer available as a distance of acceleration for electrons. The solid state insulator ultimately allows sputtering at up to a considerably higher pressure. The more completely the solid state insulator fills in the intermediate space between the base body and the shield, the better the suppression of undesirable plasma forming in this intermediate space will be.

An upper limit for the sputtering gas pressure is determined by the mean free path, which drops disproportionately with rising pressure. Beyond approximately 5 mbar, the sputtering plasma still forms, but only at a small distance (approximately 1 mm or less) from the sputtering target, because in regions of the sputtering gas that are located further away, the electrons no longer have sufficient energy to ionize the atoms of the sputtering gas. Once a plasma has formed in the vicinity of the target, no further ionization takes place beyond this plasma, because the potential of the sputtering target with respect to ground has essentially already dropped over the cathode dark space to the plasma. The electrons are not further accelerated beyond the plasma. The heat that is generated in the plasma is accordingly concentrated in a smaller region. The target surface heats highly inhomogeneously, and the sputtering plasma becomes unstable. According to the invention, the magnetic poles of at least one magnetic field source are, minimally, located approximately 1 mm apart, which at sputtering gas pressures of more than approximately 5 mbar makes the sputtering plasma measuring approximately 1 mm thin very difficult to stabilize.

The magnetic field source advantageously comprises at least one permanent magnet, the field of which is directed, through a yoke made of magnetically permeable material, to the target receiving area. If such a yoke is made of a metal, such as iron, for example, it is considerably easier to machine the same to the desired geometry than typical materials that are used to produce small permanent magnets having high field strengths. This applies in particular to a further advantageous embodiment of the invention, in which the fluxes of several permanent magnets are directed through one and the same yoke. On this embodiment, the yoke has a complicated mechanical geometry. According to one exemplary embodiment of the invention, an iron yoke and a copper holder, in which boreholes for receiving small permanent magnets are introduced, are provided. Both the iron and the copper can be machined without difficulty. In contrast, the permanent magnets are powder sintered from a rare earth alloy and are very brittle, so that they break if machining is attempted. The permanent magnets can be seated in boreholes in the copper holder. These induce a magnetic field in the direction of the target receptacle. In the iron yoke, the magnetic field is directed from the target receiving area back to the rear pole of the permanent magnet. The entire stray magnetic field is thus only produced in the vicinity of the target receiving area.

However, the magnetic field source can also comprise at least one solenoid. This has the advantage that the field strength thereof can be changed in situ without breaking the vacuum so as to locally adjust the ablation rate. However, it is technologically very complex to generate the necessary field strengths in a very tight space, because this either requires a large number of windings or a high current.

Advantageously one or more ring-shaped, honeycomb-shaped or linear arrangement of magnetic field sources is provided. To this end, the individual magnetic field sources can have differing field strengths. Such arrangements allow the ablation rate to be created homogeneously over the target surface, or to be customized in any other manner. Because, according to the invention, the respective magnetic field sources generate only locally effective fields, the field strengths thereof can be optimized independently of one another with respect to the desired distribution of the ablation rate. To this end, it is particularly advantageous if the distances between neighboring magnetic field sources are selected so that the respective regions in which 90% of the field of each source is concentrated do not overlap.

In the experiments conducted by the inventors, the layer thickness that was applied to a circular substrate having a diameter of 30 mm varied by up to 50% over the surface of the substrate, if a circular sputtering target according to the prior art was used. However, if the same target was employed together with a sputtering head according to the invention using only one annular arrangement of magnetic field sources, the layer thickness varied by only up to 10%. A homogeneous distribution of the layer thickness is essential in particular for producing laterally structured multi-layer systems. Such production processes generally include extensive etching steps, for example ion bombardment from an ion cannon, which are not self-limiting, but after through-etching of the layer to be treated must be actively stopped at the right moment. If the layer thickness varies, the layer is not fully removed by etching in some areas, and/or the layer located beneath is damaged in other areas.

A person skilled in the art requires feedback so as to optimize the field strengths. This can be obtained, for example, by depositing a layer on a substrate using an arrangement of magnetic field sources and by analyzing the distribution of the layer thickness over the substrate. If the layer thickness deviates from the desired result in an area, this is an indication that the ablation rate must be increased or decreased in a particular area of the sputtering target.

The material deposited on a particular area of the substrate is a superimposition of the material that was removed from several areas of the sputtering target at which magnets are located. In a first approximation, the share of the local deposition rate at a mod& point on the substrate that is caused by the material stemming from a particular location "k" on the target is proportional to the local degree of ionization or to the local magnetic field strength at the location "k". Based on this knowledge, it is then possible to simulate the required optimal magnetic field strength distribution for the desired spatial distribution of the deposition rate on the substrate and to position the magnetic field sources accordingly. For this purpose, for example, a linear system of equations can be generated, with which the local magnetic field strengths are found and the desired local deposition rates are the right-hand elements. The result of the highly localized effect of the magnetic field sources is then that no complicated non-linear coupling terms exist between the individual equations.

The distribution of the layer thickness can thus be optimized, especially when sputtering at high pressure, because the substrate is then located at a comparatively small distance (approximately 20 mm) from the sputtering target and the atoms or molecules that are knocked from the sputtering target essentially move in a rectilinear manner in the direction of the substrate. When sputtering at a lower pressure, both the cathode dark space and the plasma itself are considerably larger, so that the atoms or molecules travel a considerably longer path from the sputtering target to the substrate. It is then very difficult to trace the locations on the sputtering target from which the material stemmed that was deposited on a particular location on the substrate.

The edge region of a sputtering target located closest to a shield can be excluded from material ablation not only by customizing the magnetic field that is provided. As an alternative to or in combination with the above-described measures, the invention generally also relates to a sputtering head, comprising a receptacle for a sputtering target having a shield that surrounds the target receptacle so as to spatially limit the material ablation to the sputtering target, wherein a solid state insulator is provided, which can be fixed in front of the surface of the sputtering target or of the target receptacle facing the sputtering plasma, during operation the solid state insulator being able to exclude 20% or less of the surface located closest to the shield, preferably 10% or less of the surface located closest to the shield, and particularly preferably 5% or less of this surface located closest to the shield, from the material ablation.

This measure prevents flashover, which is caused by the sputtering plasma excessively approaching the gap between the target receptacle and the shield. By masking this region with the solid state insulator, a small sacrifice of usable target surface can disproportionately improve the stability of the plasma.

A guiding theme of the present invention is to improve the quality of the layers that are obtained, and in particular the homogeneity of the layer thickness, when sputtering at high sputtering gas pressure by locally influencing the material that is ablated from the sputtering target. This guiding theme is based on the finding that a reproducible causal relationship exists between the material ablation at a particular location on the sputtering target and the material deposition at a particular location on the substrate, especially when sputtering at high sputtering gas pressure, because the distance between the sputtering target and the substrate is then comparatively small. The influence can be effected by way of a suitable arrangement of magnetic field sources. This can advantageously also be effected in combination with the solid state insulator that can be fixed in front of the sputtering target.

This guiding theme is also implemented in the method according to the invention for the sputter deposition of a target material on a substrate at a sputtering gas pressure of 0.5 mbar or more, and preferably of 1 mbar or more. In the method, a plasma of the sputtering gas is formed between the target surface and the substrate. According to the invention, electrons that are emitted from the target surface in the direction of the plasma are diverted in the plasma by the field lines of one or more magnetic field sources, the magnetic north and south of which are located 10 mm or less, preferably 5 mm or less, and particularly preferably approximately 1 mm, apart.

In the same manner as in the foregoing description of the sputtering heads, it is thus assured that the degree of ionization of the sputtering plasma, and consequently also the rate of material ablation from the target, can be locally adjusted. This improves the stability of the sputtering plasma and thus allows the use of larger sputtering targets, while achieving improved homogeneity of the layer thickness that is obtained on the substrate, in particular when, in an advantageous embodiment of the method, a sputtering head according to the invention is employed.

The subject matter of the invention will be described in more detail hereafter based on figures, without thereby limiting the subject matter of the invention.

DESCRIPTION OF THE PREFERRED EMBODIMENTS

Figure 1:
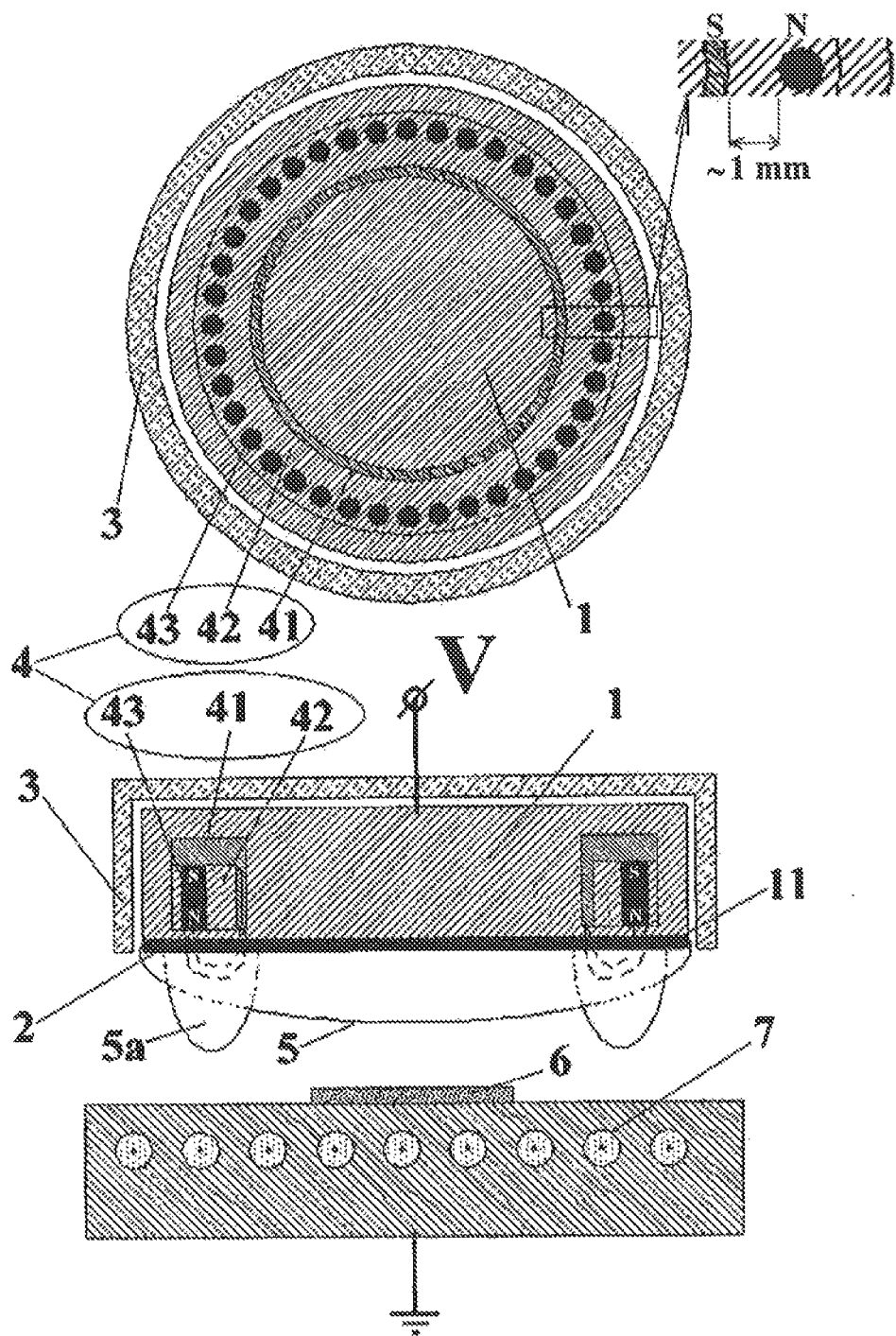
FIG. 1: shows a sputtering source comprising an exemplary embodiment of the sputtering head according to the invention.

FIG. 1 schematically illustrates design of a sputtering source comprising an exemplary embodiment of the sputtering head according to the invention. The sputtering head is shown once in a sectional view with a plane that is parallel to the substrate surface and once in a sectional view with a plane that is rotated 90° thereto out of the drawing plane. The head includes a base body 1 comprising a target receiving area 11 for a sputtering target 2 measuring 50 mm in diameter. The base body 1, which can be connected to a potential V, is a water-cooled copper block. The base body, and thus also the target receiving area 11, are connected by a shield (not shown in FIG. 1) to ground potential and are arranged at a distance from this shield because of the solid state insulator 3. An annular arrangement 4 of magnetic field sources is located in the base body. This arrangement 4 comprises a peripheral yoke ring 41 that is made of iron and includes a cut-out in which a carrier ring 42 made of copper is inserted. The carrier ring 42 comprises boreholes, in which the permanent magnets 43 are inserted. The base body 1 includes an installation space for the yoke ring 41 that is equipped with the carrier ring 42 and permanent magnets 43 (for example made of $SmCo_5$ or $Sm_2Co_{17}$), so that the permanent magnets 43 can be moved to the immediate vicinity of the target 2.

The permanent magnets 43 can directly adjoin the target receiving area 11, so that the respective local stray magnetic field is fully utilized. The sputtering power that can be used is then limited by the amount of heat produced at the sputtering target 2. For this reason, advantageously, another layer of the material of the base body is located between the magnets and the target receiving area in this exemplary embodiment. This layer dissipates at least some of the heat that is produced at the sputtering target 2, so that the sputtering target remains homogeneously cooled even with higher outputs and at least some of the heat flow originating from the sputtering target is kept away from the permanent magnets 43. This assures that the permanent magnets 43 remain clearly below the Curie temperatures thereof and maintain the ferromagnetism thereof, even at higher outputs. This also prevents the heat flow from accumulating at the permanent magnets, even at higher outputs, because the metallic copper located between the permanent magnets 43 and the target receiving area 11 is a considerably better heat conductor than the permanent magnets 43, which are sintered ceramic bodies.

Each of the permanent magnets 43 has a magnetic north and a magnetic south. The magnetic north is located in the vicinity of the target receiving area 11 in this exemplary embodiment, and the magnetic south is directed through the yoke ring 41 around the magnet 43 and the carrier ring 42 into the vicinity of the target receiving area 11. This is illustrated in FIG. 1 by an enlarged detail. Thus, a magnetic north and a magnetic south are located in the immediate vicinity of the target receiving area 11, and consequently of the target 2. A stray magnetic field forms between these two poles, which extends beyond the target into the sputtering plasma and there keeps the electrons on cycloid tracks within the plasma.

Without the arrangement 4, a distribution of the sputtering plasma in front of the target 2 takes on the shape 5. The plasma is considerably weaker at the edge of the target 2 than at the center thereof. A layer, the thickness of which is distributed highly inhomogeneously, is thereby deposited on the substrate 6, which is provided on a grounded substrate heater 7. The layer is only half as thick at the edge of the substrate as at the center. According to the invention, the sputtering plasma is locally intensified by each of the permanent magnets 43, which is indicated by additional contributions 5a to the distribution of the sputtering plasma. Overall, the degree of ionization of the sputtering plasma, and consequently also the ablation rate, are distributed considerably more homogeneously. The thickness of the layer deposited on the substrate 6 accordingly decreases toward the edge by only 10% as compared the value thereof at the center of the substrate 6.

Figure 2:
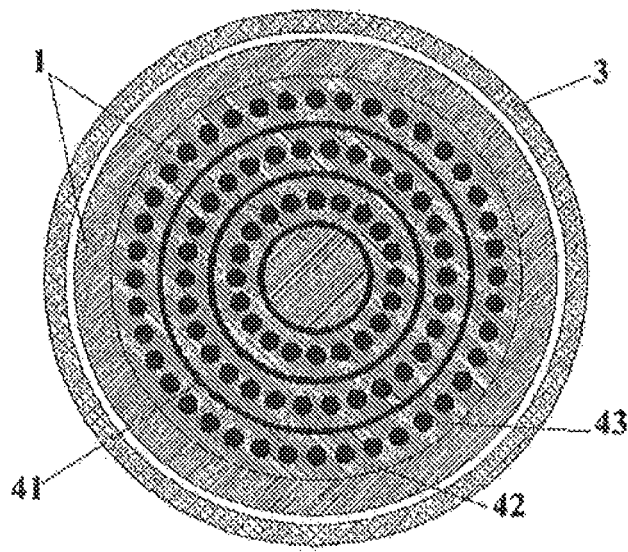
FIG. 2: shows a sputtering source that is suitable for sputtering targets measuring more than 50 mm in diameter and comprises a sputtering head according to the invention, which includes several concentric annular arrangements of magnetic field sources.
Figure 2:
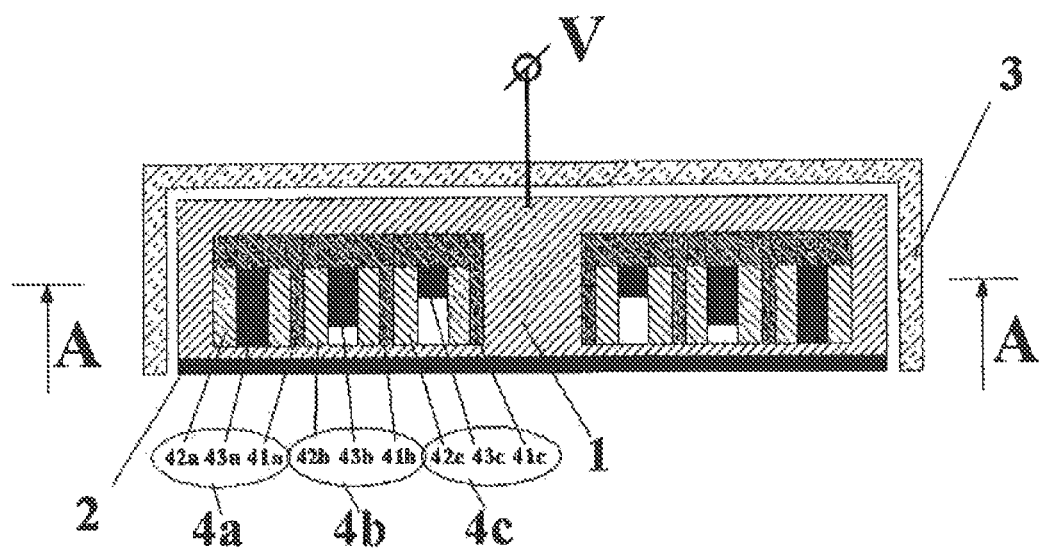

FIG. 2 shows a further exemplary embodiment of the sputtering head according to the invention, comprising three concentrically arranged, annular arrangements 4a, 4b and 4c of magnetic field sources for a target that is slightly larger than that in FIG. 1. Each of these arrangements is structured according to the same pattern as the arrangement 4 in FIG. 1. The arrangement 4a comprises a yoke ring 41a, a carrier ring 42a and permanent magnets 43a. The arrangement 4b comprises a yoke ring 41b, a carrier ring 42b and permanent magnets 43b. The arrangement 4c comprises a yoke ring 41c, a carrier ring 42c and permanent magnets 43c. To this end, the yoke rings 41a, 41b, 41c do not have to be separate components; instead, an equivalent yoke 41 can be produced from one piece. As in FIG. 1, the sputtering head is shown once in a sectional view with a plane that is parallel to the substrate surface, and once in a sectional view with a plane that is rotated 90° thereto out of the drawing plane. The orientation of the two sections relative to one another is indicated in FIG. 2 by the intersecting line A-A.

The permanent magnets 43a of the arrangement 4a locally generate the strongest magnetic fields. In contrast, the permanent magnets 43b and 43c of the arrangements 4b and 4c generate weaker magnetic fields. As is apparent from the lower part of FIG. 2, this is implemented by shortening each of the permanent magnets 43b and 43c as compared to the permanent magnet 43a, wherein the respective upper ends thereof (magnetic south) adjoin the yoke ring 41a, 41b or 41c.

The permanent magnets 43a, 43b and 43c and the yoke rings 41a, 41b and 41c attract each other, respectively, so that the permanent magnets are mechanically fixed and no gluing is required. As an alternative, the respective lower ends (magnetic north) of the permanent magnets can adjoin the layer of the base body material that separates them from the target receiving area 11. A larger portion of the stray field generated by the permanent magnets 43b and 43c would then reach the sputtering plasma. However, this is mechanically slightly more complicated to produce, because the yoke rings 41a, 41b and 41c would each have to comprise pins that extend exactly to the magnetic souths of the permanent magnets 43a, 43b and 43c, respectively.

The differences in the lengths of the permanent magnets 43a, 43b and 43c are graphically represented with significant exaggeration. The magnetic fields becoming weaker toward the inside achieves better homogeneity of the layer thickness that is obtained on the substrate. Using such a sputtering head, sputtering targets measuring 60 mm and more in diameter can be used and homogeneous layer thicknesses with homogeneous target utilization can be implemented. An even larger number of annular arrangements of permanent magnets can be arranged concentrically with respect to one another for even larger sputtering targets.

Figure 3:
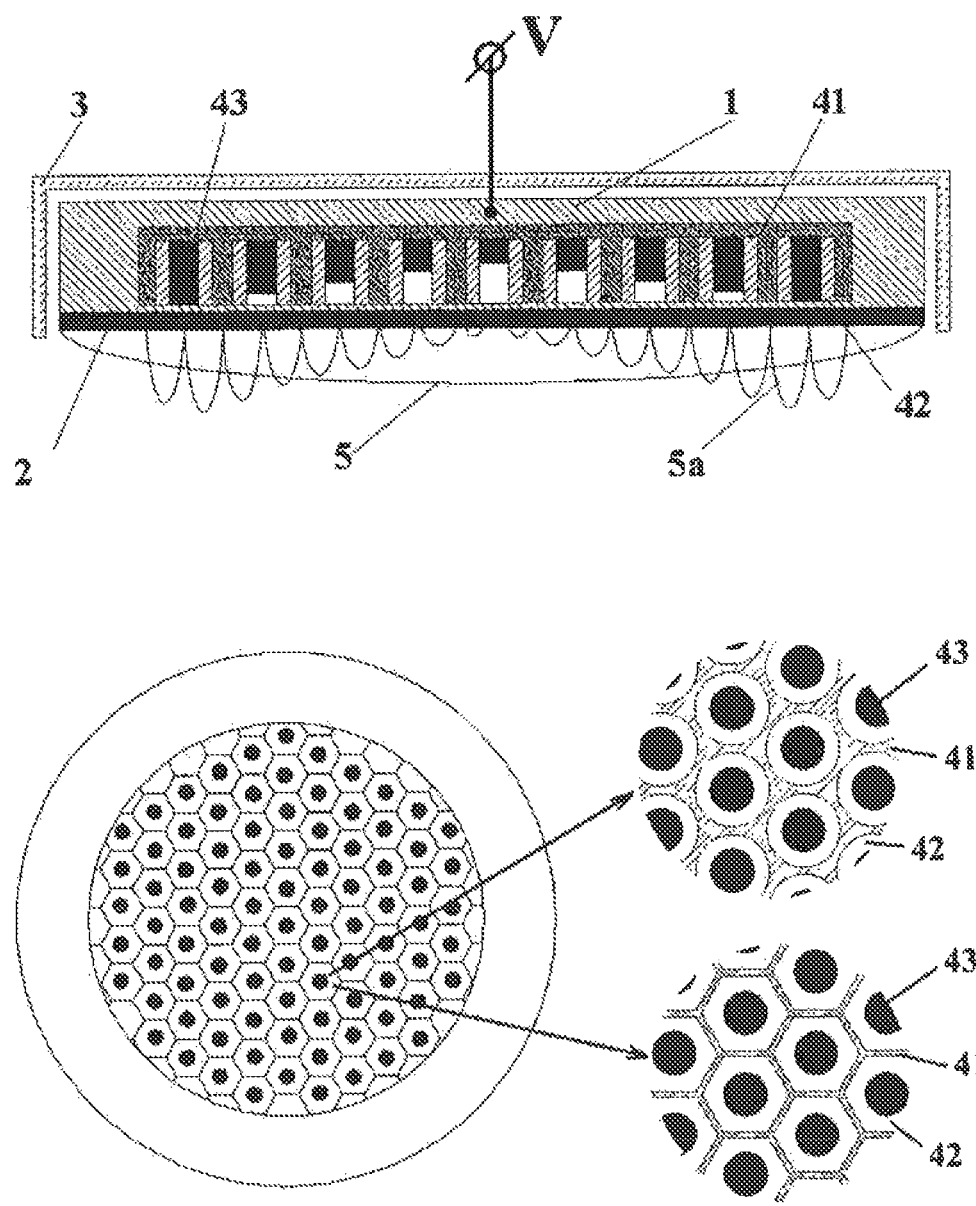
FIG. 3: shows a sputtering head that is suitable for sputtering targets measuring more than 60 mm diameter and comprises a honeycomb-shaped arrangement of magnetic field sources.

FIG. 3 shows another exemplary embodiment of the sputtering head according to the invention in sectional views with (a) a plane that is perpendicular to the substrate surface and (b) a plane that is parallel to the substrate surface. The arrangement 4 of magnetic field sources comprises an iron yoke 41 having a honeycomb-shaped structure, in the cells of which carrier elements 42 on copper and cylindrical permanent magnets 43 are inserted. If the magnetic norths of the permanent magnets 43 are oriented toward the target receptacle, the iron yoke 41 forms the magnetic south. This yoke 41 is not composed of multiple yoke rings, but is produced from one piece. The individual cells of the honeycomb structure can have a circular or polygonal (here hexagonal) cross-section.

As is indicated in FIG. 3a by the lengths of the permanent magnets 43 and the contributions 5a thereof to the distribution of the sputtering plasma, permanent magnets having differing intensities are employed. The differences in intensities are graphically represented with significant exaggeration. The weakest magnets are located at the center, with the magnets becoming stronger toward the edge. This counteracts the weakening and destabilization of the sputtering plasma toward the edge, which normally occur in the case of large targets. Such a sputtering head allows the use of sputtering targets 60 mm in diameter and larger, as in the exemplary embodiment shown in FIG. 2, and homogeneous layer thicknesses with homogeneous target utilization can be implemented.

Figure 4:
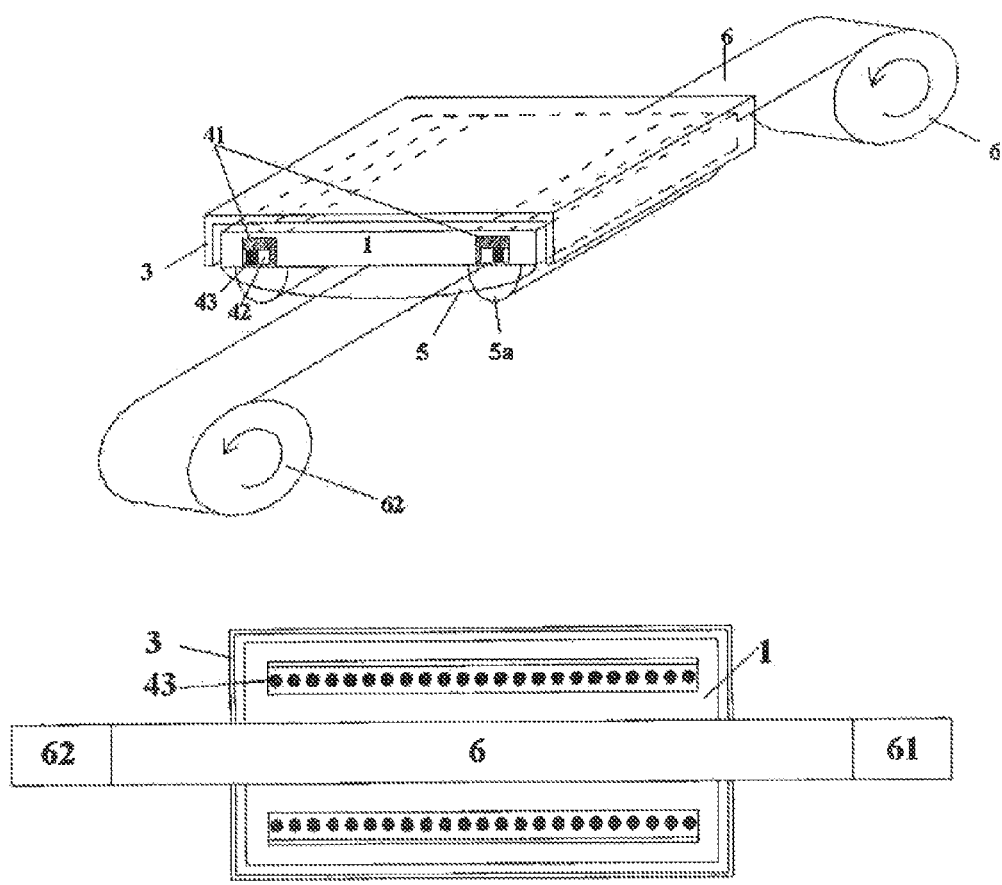
FIG. 4: shows a sputtering source comprising an exemplary embodiment of the sputtering head according to the invention for coating long substrates or bands.

FIG. 4 shows a further exemplary embodiment of the sputtering head according to the invention (a) in a perspective illustration and (b) as a sectional drawing with a plane that is parallel to the substrate surface. The substrate 6 is a band, which is unwound from a roll 61 and wound onto a roll 62 after coating. The base body 1 of the sputtering head is cuboid. L-shaped yoke beams 41 made of iron and cuboid carrier elements 42 made of copper and having boreholes are embedded therein. Permanent magnets 43 are inserted in the boreholes of the carrier elements 42. The yoke beam 41, carrier elements 42 and permanent magnets 43 together form the arrangement 4 of magnetic field sources. The sputtering target 2 and the substrate heater are not shown for reasons of clarity.

Analogously to FIG. 1, the magnetic north of each permanent magnet 43 is located in the immediate vicinity of the target receiving area 11 for the sputtering target, while the magnetic south is directed through the L-shaped yoke beam 41 into the vicinity of the target receiving area. The resulting stray field extends into the sputtering plasma and enriches the distribution 5 of the same by additional contributions 5a. The degree of ionization of the plasma is thus homogenized over the width of the sputtering head, so that a homogeneous layer can be applied over the entire width of the substrate 6. The treatment zone can have a length between approximately 100 and approximately 1000 mm, for example. According to the invention, the substrate band 6 continually passes the sputtering head and is coated.

Figure 5:
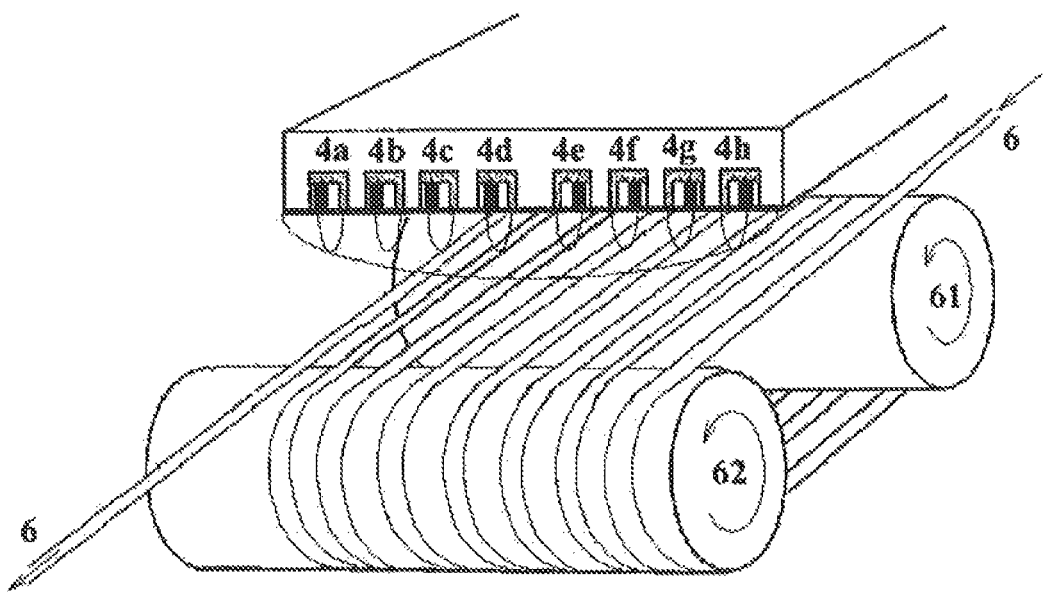
FIG. 5: is a modification of the exemplary embodiment shown in FIG. 4, having a higher coating rate per unit of time.

FIG. 5 shows a modification of the exemplary embodiment shown in FIG. 4. As in FIG. 4, the substrate heater is not shown. Here, the substrate band 6 is not unwound from the roll 61 and wound onto the roll 62. Instead, the band is diverted multiple times by these two rolls, which rotate in the same direction, so that the band runs beneath several linear arrangements 4a to 4h of magnetic field sources and is further coated in each case. This exemplary embodiment of the sputtering head allows a predetermined layer thickness to be applied to a larger band length per unit of time than is possible with the exemplary embodiment shown in FIG. 4.

Figure 6:
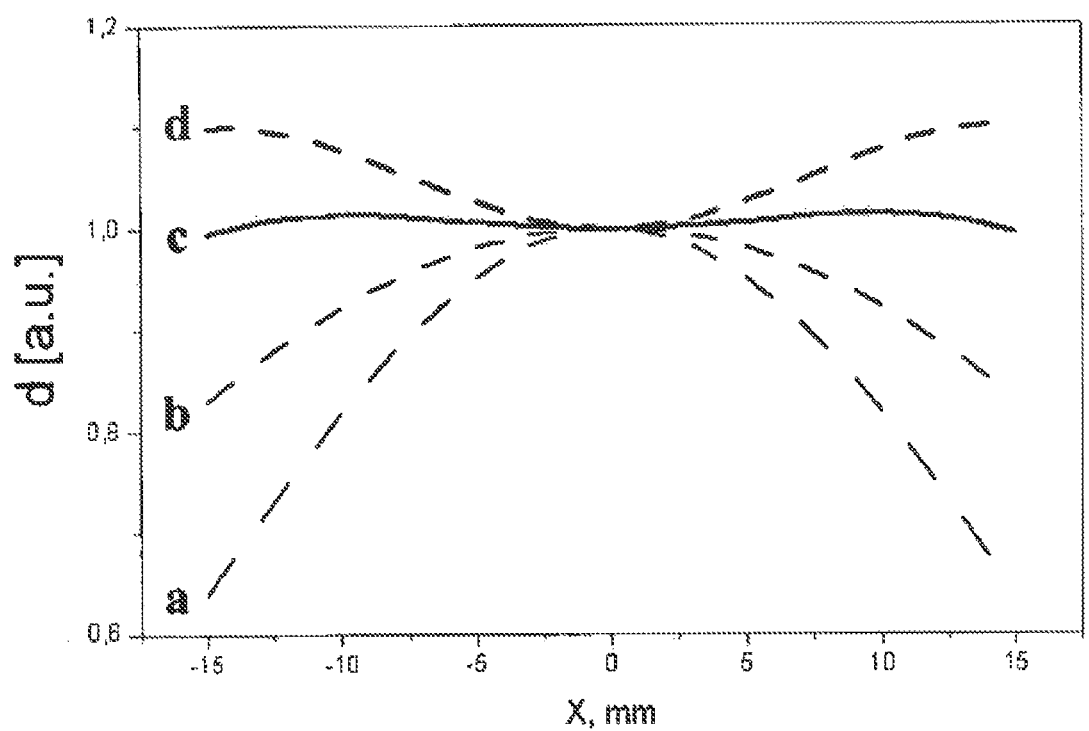
FIG. 6: shows the homogenization of the layer thickness distribution on a substrate measuring 30 mm in diameter by optimizing the distribution and strength of local magnetic field sources.

FIG. 6 shows the extent to which the local optimization of the sputtering rate by local magnetic fields according to FIG. 1 can improve the homogeneity of the layers that are obtained during sputtering. The drawing shows the respective layer thickness d as a function of the distance X from the substrate center for a circular substrate having a diameter of 30 mm. The layer thickness is standardized in arbitrary units to the value thereof at the center of the substrate. Curve a shows the distribution of the layer thickness for a sputtering head without the magnetic field sources that are provided according to the invention. Curve b shows the distribution that a sputtering head generates using an arrangement of magnetic field sources according to the invention that is not yet optimal. Clear improvement is already apparent here; for example, the region in which the layer thickness does not drop below 90% of the value thereof at the substrate center is approximately one third wider. Curve c shows the distribution that is obtained for the optimal distribution of magnetic field sources. Practically over the entire substrate diameter of 30 mm, the layer thickness deviates by less than approximately 3% from the value thereof at the center of the substrate. Such minor deviations can generally be tolerated for functional layers. Curve d shows the layer thickness distribution for the case of strong magnetic field sources according to FIG. 1. Here, the drop in layer thickness toward the edge, which prompted the use of the local magnetic field sources, was overcompensated.

Figure 7:
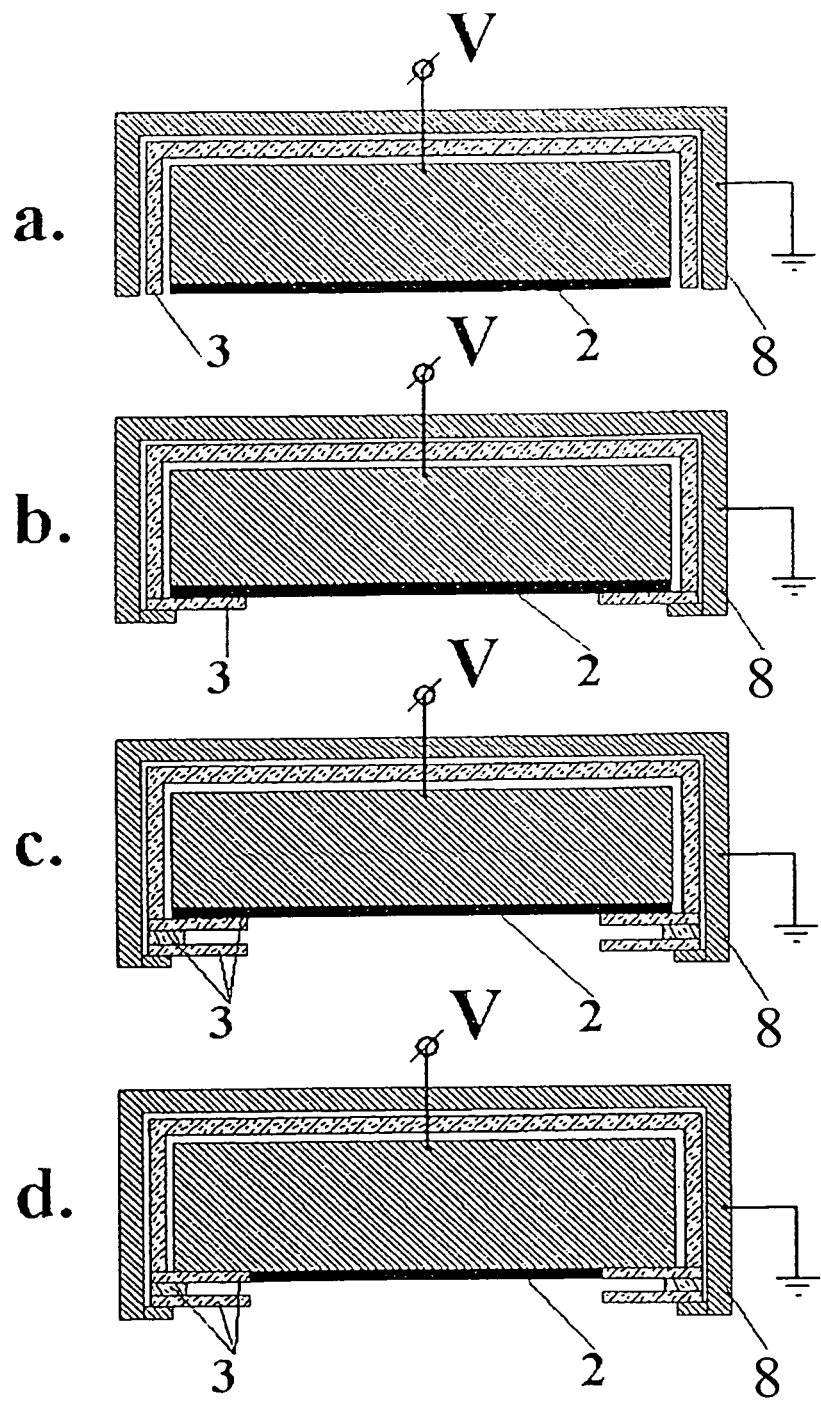
FIGS. 7a-7d show sectional drawings of exemplary embodiments of sputtering heads according to the invention comprising solid state insulators.

FIG. 7 shows sectional drawings of exemplary embodiments of sputtering heads according to the invention comprising solid state insulators. In FIG. 7a, only one solid state insulator 3 is provided between the base body 1 and the shield 8.

In FIG. 7b, an additional annular solid state insulator 32 is provided, which covers the edge region of the sputtering target 2. This insulator 33 prevents the sputtering plasma from extending to the edge and there resulting in direct electric flashover between the base body 1 or the target 2 and the shield 8.

However, this protection may be lost if some of this conductive material that is ablated from the target 2 is deposited on the insulator 33. For this reason, the exemplary embodiment shown in FIG. 7c provides an additional insulator ring 34, which is arranged at a distance from the first insulator ring 33 by way of one or more spacers 35. Material that is ablated from the target can then only be deposited on the insulator ring 34, but not on the insulator ring 33.

In FIG. 7d, the insulator ring 33 is not arranged in front of the surface of the target 2, but in front of the surface of the target receptacle 11. Undesirable material ablation in the edge region that is located closest to the shield, which can result in electric flashover, is prevented in the same manner as in the exemplary embodiment shown in FIG. 7c. However, contrary to FIG. 7c, a smaller and therefore less expensive target can be used, the entire surface of which is utilized. In FIGS. 7b and 7c, the respective region of the target 2 that is covered by the insulator ring 33 is unused.

The invention claimed is:

1. A method for the sputter deposition of a target material on a substrate at a pressure of 0.5 to 5.0 mbar using a sputtering head comprising a sputtering target, a base body, a shield, a solid state insulator, a ferromagnetic yoke body, a plurality of ferromagnetic carrier elements, and a plurality of permanent magnets, the base body adapted as a receptacle receiving the sputtering target, the shield adapted to limit material ablation of the sputtering target, the solid state insulator arranged between the base body and the shield, the yoke body located in the base body and having a plurality of cells, each one cell of the plurality of cells comprising an axially-extending portion and a base portion, each one cell of the plurality of cells having a corresponding one of the plurality of ferromagnetic carrier elements situated therein abutting said base portion and axially-extending portion, said one ferromagnetic carrier element having a axially-extending through-hole with said corresponding one permanent magnet situated therein, the plurality of permanent magnets being spaced apart by less than 5 mm, the method comprising:
configuring the sputtering head so that each one of the plurality of permanent magnets has a common pole alignment with a common one pole of a north pole or south pole at a first end in contact with said base portion and a common other one of the north pole and south pole at an opposite second end;
forming a plasma of a sputtering gas between the substrate and a surface of the target with a distance of separation between the sputtering target and the sputtering plasma being less than 1 mm;
emitting electrons from the target surface in a direction of the plasma;
diverting the electrons in the plasma by one or more magnetic field sources formed by said plurality of permanent magnets and corresponding plurality of carrier elements, the ferromagnetic yoke guiding magnetic field lines of said one or more magnetic field sources so that the magnetic field lines traverse from said common one pole through said base portion of a corresponding cell of said yoke body, along said axially-extending walls of said corresponding cell, through said sputtering target received at the base body, and back through said sputtering target to said common other one pole; and
wherein a distance between magnetic north pole and south pole of each one of said one or more magnetic field sources spans 1 mm to less than 5 mm along which a stray field forms; and
wherein the strength of said one or more magnetic field sources increases from the center toward the edge of the target surface.

2. A sputtering head, comprising:
a sputtering target;
a base body serving as a receptacle that receives the sputtering target;
a shield adapted to spatially limit material ablation at the sputtering target;
a solid state insulator arranged between the base body and the shield;
a yoke ring having an L-shaped cross-section in which a base portion of the yoke ring Is a base of the L-shaped cross-section and an axially-extending portion is a standing portion of the L-shaped cross-section;
a carrier ring having a plurality of axially-extending through-holes, the carrier ring situated on the base portion of the yoke ring and extending to an axial height of the axially-extending portion of the yoke ring;
a plurality of permanent magnets carried by the carrier ring, each one of the plurality of permanent magnets being situated in a respective one of the plurality of through-holes, the plurality of permanent magnets being circumferentially spaced to be circumferentially separated by less than 5 mm;
wherein the yoke ring, the carrier ring, and the plurality of permanent magnets are located in the base body;
wherein said axially-extending portion of the yoke ring is located radially inward of the carrier ring so as to be located radially inward of all of said plurality of permanent magnets carried by said carrier ring;
wherein all permanent magnets carried by the carrier ring have a common pole alignment with a common one pole of a north pole or south pole at a first end in contact with the base portion of the yoke ring and a common other one of the north pole and south pole at an opposite, second end; and
wherein the yoke ring is ferromagnetic so that a respective magnetic field of each one of said plurality of permanent magnets traverses from said common one pole through said yoke ring base portion, along said yoke ring axially-extending portion, through said sputtering target received at the base body, and back through said sputtering target to said common other one pole.

3. The sputtering bead of claim 2, wherein for each one of said plurality of permanent magnets, said common other one of the north pole and south pole has closest radial separation distance from a nearest point of said axially-extending portion of said yoke ring that is 1 mm to less than 5 mm, so that magnetic north and magnetic south of each local magnetic field formed by the plurality of permanent magnets are spaced from 1 mm to less than 5 mm apart.

4. The sputtering head of claim 2, wherein the yoke ring, carrier ring and plurality of permanent magnets are a first yoke ring, first carrier ring and first plurality of permanent magnets that form a first annular configuration of magnetic fields; and further comprising at least one additional annular configuration of magnetic fields formed by a second yoke ring, second carrier ring, and second plurality of permanent magnets located radially inward of said first yoke ring, first carrier ring and first plurality of permanent magnets, the second plurality of permanent magnets being carried by said second carrier ring.

5. The sputtering head of claim 2, wherein strength of the respective magnetic fields for the plurality of permanent magnets increases from the center toward the edge of the target receptacle.

6. The sputtering head of claim 2, wherein in a projection of a stray field of each magnetic field onto the surface of the target receptacle, the region in which at least 90% of magnetic field strength is concentrated is located completely outside a predetermined region that is to be spared from ablation.

7. The sputtering head of claim 2, wherein the solid state insulator during operation is configured to exclude 20% or less of the surface located closest to the shield from the material ablation.

8. The sputtering head of claim 2, wherein the solid state insulator during operation is configured to exclude 10% or less of the surface located closest to the shield from the material ablation.

9. The sputtering head of claim 2, wherein the solid state insulator during operation is configured to exclude 5% or less of the surface located closest to the shield from the material ablation.

10. A sputtering head, comprising:
a sputtering target;
a base body serving as a receptacle that receives the sputtering target;
a shield adapted to spatially limit material ablation at the sputtering target;
a solid state insulator arranged between the base body and the shield;
a yoke body located in the base body and having a plurality of cells in a honeycomb configuration, each one cell of the plurality of cells being defined by axially-extending walls and a base portion;
a plurality of carrier elements, each one carrier element of the plurality of carrier elements being situated in a corresponding one cell of said plurality of cells to abut said base portion and axially-extending walls of said corresponding one cell, said each one carrier element having an axially-extending through-hole;
a plurality of permanent magnets, each one permanent magnet being situated in the axially-extending through-hole of a corresponding one carrier element of said plurality of carrier elements, said each one permanent magnet being spaced apart from other ones of said plurality of permanent magnets by less than 5 mm;
wherein all permanent magnets in the yoke body have a common pole alignment with a common one pole of a north pole or south pole at a first end in contact with the base portion of the yoke body and a common other one of the north pole and south pole at an opposite, second end; and
wherein the yoke body is ferromagnetic so that a respective magnetic field of each one of said plurality of permanent magnets traverses from said common one pole through said base portion of a corresponding cell of said yoke body, along said axially-extending walls of said corresponding cell, through said sputtering target received at the base body, and back through said sputtering target to said common other one pole.

11. The sputtering head of claim 10, wherein for each one of said plurality of permanent magnets, said common other one of the north pole and south pole has closest separation distance from a nearest point of said axially-extending walls of said corresponding cell that is 1 mm to less than 5 mm, so that magnetic north and magnetic south of each local magnetic field formed by the plurality of permanent magnets are spaced 1 mm to less than 5 mm apart.

12. The sputtering head of claim 10, wherein each one carrier element of the plurality of carrier elements has a cross section with a polygonal periphery.

13. The sputtering head of claim 10, wherein each one carrier element of the plurality of carrier elements has a has a cross section with a circular periphery.

14. The sputtering head of claim 10, wherein in a projection of a stray field of each magnetic field onto the surface of the target receptacle, the region in which at least 90% of magnetic field strength is concentrated is located completely outside a predetermined region that is to be spared from ablation.

15. The sputtering head of claim 10, wherein the solid state insulator during operation is configured to exclude 20% or less of the surface located closest to the shield from the material ablation.

16. The sputtering head of claim 10, wherein the solid state insulator during operation is configured to exclude 10% or less of the surface located closest to the shield from the material ablation.

17. The sputtering head of claim 10, wherein the solid state insulator during operation is configured to exclude 5% or less of the surface located closest to the shield from the material ablation.

18. The sputtering head of claim 10, wherein said each one carrier element of the plurality of carrier elements has said axially-extending walls surrounding an entire circumference of said carrier element.

19. The sputtering head of claim 2, wherein a portion of said base body is positioned axially between said sputtering target and each of said yoke ring, carrier ring, and plurality of permanent magnets.

20. The method for sputter deposition of claim 1, wherein the distance of separation between the sputtering target and the sputtering plasma is less than 0.1 mm.

21. A method for the sputter deposition of a target material on a substrate at a pressure of 0.5 to 5.0 mbar using a sputtering head comprising a sputtering target, a base body, a shield, a solid state insulator, a ferromagnetic yoke ring, a ferromagnetic carrier ring, and a plurality of permanent magnets, the base body adapted as a receptacle receiving the sputtering target, the shield adapted to limit material ablation of the sputtering target, the solid state insulator arranged between the base body and the shield, the yoke ring located in the base body and having an L-shaped cross-section in which a base portion of the yoke ring is a base of the L-shaped cross-section and an axially-extending portion is a standing portion of the L-shaped cross-section, the ferromagnetic carrier ring having a plurality of axially-extending through-holes, the carrier ring situated on the base portion of the yoke ring and extending to an axial height of the axially-extending portion of the yoke ring, each one of the plurality of permanent magnets being situated in a respective one of the plurality of through-holes, the plurality of permanent magnets being circumferentially spaced to be circumferentially separated by less than 5 mm, the method comprising:
configuring the sputtering head so that each one of the plurality of permanent magnets has a common pole alignment with a common one pole of a north pole or south pole at a first end in contact with said base portion and a common other one of the north pole and south pole at an opposite second end;
forming a plasma of a sputtering gas between the substrate and a surface of the target with a distance of separation between the sputtering target and the sputtering plasma being less than 1 mm;
emitting electrons from the target surface in a direction of the plasma; and
diverting the electrons in the plasma by one or more magnetic field sources formed by said plurality of permanent magnets and the carrier ring, the ferromagnetic yoke guiding magnetic field lines of said one or more magnetic field sources so that the magnetic field lines traverse from said common one pole through said base portion of said yoke ring, along said axially-extending portion of said yoke ring, through said sputtering target received at the base body, and back through said sputtering target to said common other one pole; and wherein a distance between magnetic north pole and south pole of each one of said one or more magnetic field sources spans 1 mm to less than 5 mm along which a stray field forms; and wherein the strength of said one or more magnetic field sources increases from the center toward the edge of the target surface.

22. The method for sputter deposition of claim 21, wherein the distance of separation between the sputtering target and the sputtering plasma is less than 0.1 mm.

* * * * *